United States Patent
Shiramizu et al.

(10) Patent No.: US 10,319,269 B2
(45) Date of Patent: Jun. 11, 2019

(54) LASER LIGHT SOURCE DEVICE AND DISPLAY APPARATUS

(71) Applicant: Panasonic Intellectual Property Management Co., Ltd., Osaka (JP)

(72) Inventors: Takahisa Shiramizu, Osaka (JP); Tetsuro Mizushima, Tokyo (JP); Junichi Mutoh, Osaka (JP); Susumu Uragami, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 228 days.

(21) Appl. No.: 15/139,195

(22) Filed: Apr. 26, 2016

(65) Prior Publication Data

US 2016/0343280 A1 Nov. 24, 2016

(30) Foreign Application Priority Data

May 22, 2015 (JP) ................................. 2015-104080

(51) Int. Cl.
*G09G 3/02* (2006.01)
*H04N 9/31* (2006.01)
(Continued)

(52) U.S. Cl.
CPC ............. *G09G 3/025* (2013.01); *G09G 3/02* (2013.01); *H01S 5/06216* (2013.01); *H04N 9/31* (2013.01);
(Continued)

(58) Field of Classification Search
CPC ....................................................... G09G 3/02
See application file for complete search history.

(56) References Cited

U.S. PATENT DOCUMENTS

| 7,059,523 B1* | 6/2006 | Yavid ....................... H04N 3/08 235/454 |
| 2007/0086495 A1* | 4/2007 | Sprague .............. H01S 5/06804 372/38.02 |

(Continued)

FOREIGN PATENT DOCUMENTS

| JP | 2001-189520 | 7/2001 |
| JP | 2011-508982 A | 3/2011 |

(Continued)

OTHER PUBLICATIONS

Definition "reciprocally" downloaded Dec. 8, 2018 from http://www.thefreedictionary.com/reciprocally, pp. 1-3 (Year: 2018).*

*Primary Examiner* — Dorothy Harris
(74) *Attorney, Agent, or Firm* — McDermott Will & Emery LLP

(57) ABSTRACT

A laser light source device includes a semiconductor laser, a current supplying unit to supply a driving current to the semiconductor laser, and a signal generator to generate current intensity data for setting an intensity of the driving current. The signal generator generates, for an input signal corresponding to continuous pixels for a same color, a plurality of sets of the current intensity data indicating current intensities different from each other, and transmits the plurality of sets of the current intensity data to the current supplying unit while sequentially switching the plurality of sets of the current intensity data. The current supplying unit drives the semiconductor laser based on the plurality of different sets of the current intensity data.

5 Claims, 13 Drawing Sheets

(51) Int. Cl.
*H01S 5/062* (2006.01)
*H01S 5/40* (2006.01)

(52) U.S. Cl.
CPC .......... *H04N 9/3129* (2013.01); *H01S 5/4012* (2013.01); *H01S 5/4093* (2013.01)

(56) References Cited

U.S. PATENT DOCUMENTS

| | | | |
|---|---|---|---|
| 2008/0218835 A1* | 9/2008 | Sandner | G02B 26/101 359/238 |
| 2009/0175302 A1* | 7/2009 | Bazzani | H01S 5/06209 372/26 |
| 2010/0283413 A1* | 11/2010 | Richter | G02B 26/101 315/360 |
| 2012/0133902 A1* | 5/2012 | Nishioka | G02B 27/48 353/31 |
| 2012/0188623 A1* | 7/2012 | Inoue | G02B 26/101 359/197.1 |
| 2013/0258210 A1 | 10/2013 | Kurihara et al. | |
| 2014/0092316 A1* | 4/2014 | Rumreich | G02B 26/101 348/744 |
| 2014/0320829 A1* | 10/2014 | Woltman | H04N 9/3129 353/98 |

FOREIGN PATENT DOCUMENTS

| | | |
|---|---|---|
| JP | 2013-211308 A | 10/2013 |
| JP | 2014-106378 A | 6/2014 |
| WO | 2015/010715 A1 | 1/2015 |

\* cited by examiner

LASER LIGHT SOURCE DEVICE AND DISPLAY APPARATUS

BACKGROUND

1. Field of the Invention

The present disclosure relates to a laser light source device and a display apparatus using a semiconductor laser as a light source.

2. Description of the Related Art

In recent years, a technique using a semiconductor laser as a light source of a display apparatus has been paid attention. The semiconductor laser has various advantages as compared with a mercury lamp that has been commonly used in a conventional display apparatus. That is, the semiconductor laser is good in color reproducibility, is capable of momentary lighting, and is a device having a longer operating life. And the semiconductor laser is also capable of reducing consumption current because of high efficiency, and is easy to be downsized.

The display apparatus using such a semiconductor laser is suitable to be incorporated in a small electronic apparatus, and a technique is known for, for example, incorporating a display apparatus using a semiconductor laser in a head up display (refer to Unexamined Japanese Patent Publication No. 2001-189520).

SUMMARY

A laser light source device according to a first aspect of the present disclosure includes a semiconductor laser for emitting laser light, a current supplying unit to supply a driving current to the semiconductor laser, and a signal generator to generate current intensity data for setting an intensity of the driving current. The signal generator generates, for an input signal corresponding to continuous pixels for a same color, a plurality of sets of the current intensity data indicating current intensities different from each other, and transmits the plurality of sets of the current intensity data to the current supplying unit while sequentially switching the plurality of sets of the current intensity data. The current supplying unit drives the semiconductor laser based on the plurality of sets of the current intensity data.

A display apparatus according to a second aspect of the present disclosure includes the above laser light source device, and a scanning unit to two-dimensionally scan the laser light emitted from the laser light source device. The signal generator switches the plurality of sets of the current intensity data for each line for which the scanning unit scans the laser light.

According to the present disclosure, a plurality of sets of current intensity data indicating current intensities different from each other is generated for an input signal corresponding to continuous pixels for a same color, and the semiconductor laser is driven based on the plurality of sets of current intensity data while sequentially switching the plurality of sets of current intensity data, so that the semiconductor laser is driven by the currents having individual different current intensities switched during the driving. Since the semiconductor laser slightly changes its light emission wavelength depending on the switching of the driving current, a width of a light emission wavelength of synthesized laser light is able to increase. Therefore, speckle noise of the laser light source device or the display apparatus can be reduced.

DETAILED DESCRIPTION OF THE EMBODIMENT

Figure 1:
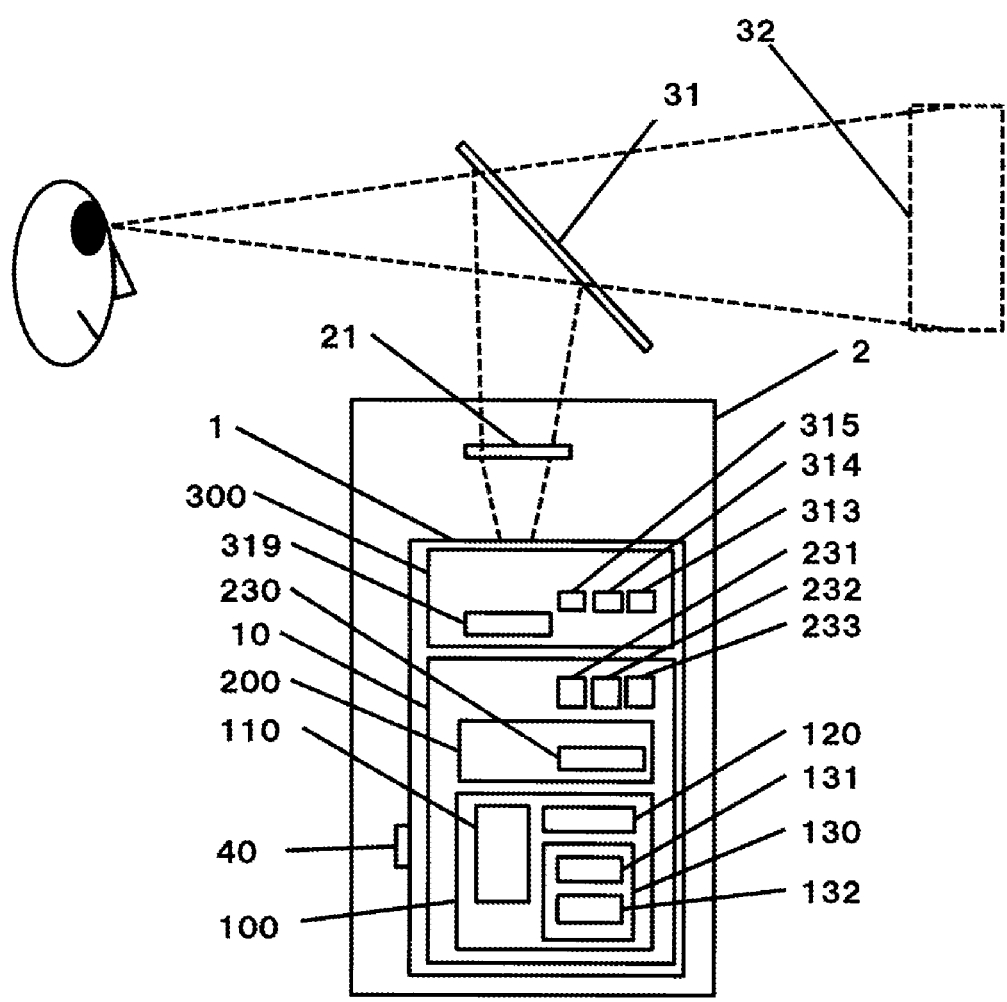
FIG. 1 is a diagram illustrating a display apparatus according to an exemplary embodiment.

Before describing an exemplary embodiment of the present disclosure, a problem in a laser light source device and a display apparatus in related art will be described. In a display apparatus using a semiconductor laser, the semiconductor laser used as a light source has distinctive coherence properties, so that wave fronts randomly reflected by a screen and the like interfere to each other. This interference generates speckle noise that irritates the eyes of a person to mainly cause deterioration of image quality in the display apparatus using a semiconductor laser. To reduce the speckle noise, the technique described in Unexamined Japanese Patent Publication No. 2001-189520 applies a voltage having very sharp pulse like rising waveforms to a semiconductor laser to generate relaxation oscillation, thereby reducing the speckle noise.

However, this technique needs high speed switching properties in a laser diode driver (LDD). The switching properties of an existing laser driver disadvantageously fail to obtain a sufficient effect to reduce speckle noise.

The present disclosure provides a laser light source device and a display apparatus capable of reducing speckle noise.

A laser light source device according to a first disclosure includes a semiconductor laser for emitting laser light, a current supplying unit to supply a driving current to the semiconductor laser, and a signal generator to generate current intensity data for setting an intensity of the driving current. The signal generator generates, for an input signal corresponding to continuous pixels for a same color, a plurality of sets of the current intensity data indicating current intensities different from each other, and transmits the plurality of sets of the current intensity data to the current supplying unit while sequentially switching the plurality of sets of the current intensity data. The current supplying unit drives the semiconductor laser based on the plurality of sets of the current intensity data. According to the first disclosure, a plurality of sets of current intensity data indicating current intensities different from each other is generated for an input signal corresponding to continuous pixels for a same color, and the semiconductor laser is driven based on the plurality of sets of current intensity data while sequentially switching the plurality of sets of current intensity data, so that the semiconductor laser is driven by the currents having individual different current intensities switched during the driving. Since the semiconductor laser slightly changes its light emission wavelength depending on the switching of the driving current, a width of a light emission wavelength of the synthesized laser light is able to increase. Therefore, speckle noise of the laser light source device can be reduced. Herein, the width of the light emission wavelength denotes a half value width of the light emission wavelength in the diagram of the relation between light emission wavelength and light emission power.

A display apparatus according to a second disclosure includes the laser light source device according to the first disclosure and a scanning unit to two-dimensionally scan the laser light emitted from the laser light source device. The signal generator switches the plurality of sets of the current intensity data for each line for which the scanning unit scans the laser light. According to the second disclosure, the semiconductor laser is driven by the currents having individual different current intensities switched during the driving. Since the semiconductor laser slightly changes its light emission wavelength depending on the switching of the driving current, a width of a light emission wavelength of synthesized laser light is able to increase. Therefore, speckle noise of the display apparatus can be reduced. Furthermore, since the scanning unit switches a plurality of sets of current intensity data for each line for which the scanning unit scans the laser light, gray scale gap between adjacent lines of displayed image generated during driving the semiconductor laser for light emission by using a plurality of sets of current intensity data can be averaged. Therefore, deterioration of image quality can be suppressed.

In a display apparatus according to a third disclosure, the signal generator switches the plurality of sets of the current intensity data at a moment when the scanning unit switches a scanning of the laser light from a left direction to a right direction, or at a moment when the scanning unit switches a scanning of the laser light from the right direction to the left direction. According to the third disclosure, since a plurality of sets of current intensity data is switched at a moment when a scanning is switched from the left direction to the right direction, or at a moment when a scanning is switched from the right direction to the left direction, gray scale gap between adjacent lines of displayed image generated during driving the semiconductor laser for light emission by using a plurality of sets of current intensity data can be effectively averaged. Therefore, deterioration of image quality can be suppressed.

In a display apparatus according to a fourth disclosure, the scanning unit performs a first scanning for scanning in a first direction and a second scanning for scanning in a second direction perpendicular to the first direction. The first scanning is faster than the second scanning in scanning speed. The signal generator switches the plurality of sets of the current intensity data in synchronization with a cycle of the first scanning and alternates an order of switching the plurality of sets of the current intensity data in synchronization with a cycle of the second scanning According to the fourth disclosure, a plurality of sets of current intensity data is switched in synchronization with the cycle of the first scanning, and the order of switching the plurality of sets of current intensity data is alternated in synchronization with the cycle of the second scanning. This increases a width of a light emission wavelength of the light emitted from the semiconductor laser, because a plurality sets of current intensity data is set for the first scanning that performs a high speed scanning in a two dimensional display apparatus that performs a first canning and a second scanning Therefore, speckle noise of the display apparatus can be effectively reduced.

In a display apparatus according to a fifth disclosure, the signal generator alternates the order of switching the plurality of sets of the current intensity data for each cycle in which one line of one frame is scanned. According to the fifth disclosure, since the order of switching a plurality of sets of current intensity data is alternated for each cycle in which one line of one frame is scanned, efficiency of averaging gray scale gap of displayed image generated during driving the semiconductor laser for light emission by using a plurality of sets of current intensity data can be improved. Therefore, deterioration of image quality can be suppressed.

In a display apparatus according to a sixth disclosure, the signal generator alternates the order of switching the plurality of sets of the current intensity data for each cycle in which one frame is scanned. According to the sixth disclosure, since the order of switching a plurality of sets of current intensity data is alternated for each cycle in which one frame is scanned, gray scale gap between frames of displayed image generated during driving the semiconductor laser for light emission by using a plurality of sets of current intensity data can be averaged. Therefore, deterioration of image quality can be suppressed.

In a display apparatus according to a seventh disclosure, the signal generator switches the plurality of sets of the current intensity data in a time interval shorter than one pixel time constituting the input signal. According to the seventh disclosure, since a plurality of sets of current intensity data is switched in a time interval shorter than one pixel time constituting the input signal, the semiconductor laser with different current intensities that are switched in a short time interval is driven. Therefore, speckle noise of the display apparatus can be further reduced.

In a display apparatus according to an eighth disclosure, the scanning unit performs a first scanning for scanning in a first direction and a second scanning for scanning in a second direction perpendicular to the first direction. The second scanning is performed at a speed different from a speed of the first scanning. The signal generator alternates an order of switching the plurality of sets of the current intensity data in one pixel time in synchronization with a cycle of the second scanning According to the eighth disclosure, since the order of switching a plurality of sets of current intensity data in one pixel time is alternated in synchronization with the cycle of the second scanning, gray scale gap for each line of displayed image generated during driving the semiconductor laser for light emission by using a plurality of sets of current intensity data can be averaged. Therefore, deterioration of image quality can be suppressed.

In a display apparatus according to a ninth disclosure, the signal generator alternates the order of switching the plurality of sets of the current intensity data for each cycle in which one line of one frame is scanned. According to the ninth disclosure, since the order of switching a plurality of sets of current intensity data is alternated for each cycle in which one line of one frame is scanned, efficiency of averaging gray scale gap between lines of displayed image generated during driving the semiconductor laser for light emission by using a plurality of different sets of current intensity data in one pixel time can be improved. Therefore, deterioration of image quality can be suppressed.

In a display apparatus according to a tenth disclosure, the signal generator switches the plurality of sets of the current intensity data at a moment when the scanning unit switches a scanning of the laser light from a left direction to a right direction, or at a moment when the scanning unit switches a scanning of the laser light from the right direction to the left direction. According to the tenth disclosure, since a plurality of sets of current intensity data is switched at a moment when a scanning of the laser light is switched from the left direction to the right direction, or at a moment when a scanning of the laser light is switched from the right direction to the left direction, efficiency of averaging gray scale gap for each line of displayed image generated during driving the semiconductor laser for light emission by using a plurality of sets of current intensity data in one pixel time can be further improved. Therefore, deterioration of image quality can be suppressed.

Exemplary Embodiment

Hereinafter, an exemplary embodiment of the present disclosure will be described with reference to the drawings. FIG. 1 is a diagram illustrating a display apparatus according to the exemplary embodiment of the present disclosure. Specifically, FIG. 1 illustrates an example of head up display 2 for a vehicle mounted on a vehicle.

Display apparatus 1 includes laser light source device 10 and scanning unit 300. Laser light source device 10 has three semiconductor lasers 231, 232, 233, signal generator 100, and current supplying unit 200. Current supplying unit 200 supplies a driving current to each of three semiconductor lasers 231, 232, 233. Semiconductor laser 231 is a red semiconductor laser that emits red laser light, semiconductor laser 232 is a green semiconductor laser that emits green laser light, and semiconductor laser 233 is a blue semiconductor laser that emits blue laser light.

Signal generator 100 includes image memory 120, laser emission setting register 130, and signal generating circuit 110. Image memory 120 temporarily stores an image signal. Laser emission setting register 130 sets a plurality of current intensities different from each other and an emission timing. Signal generating circuit 110 generates current intensity data for setting the intensity of a driving current for driving each of three semiconductor lasers 231, 232, 233 as a signal that can be processed by current supplying unit 200. Laser emission setting register 130 includes first laser emission setting register 131 and second laser emission setting register 132. Signal generator 100 generates current intensity data based on the image signal input from external input terminal 40 and transmits the current intensity data to current supplying unit 200. At this time, signal generator 100 generates, for an input signal corresponding to continuous pixels for a same color, a plurality of sets of current intensity data indicating current intensities different from each other and sequentially switches the plurality of sets of the current intensity data. Current supplying unit 200 supplies current to three semiconductor lasers 231, 232, 233 using semiconductor laser power circuit 230 that is a constituent element of current supplying unit 200 based on the plurality of sets of current intensity data supplied from signal generator 100 to drive semiconductor lasers 231, 232, 233. Note that in the present application, the current intensity is a value of the current intensity data for setting the driving current for the semiconductor laser. That is, the driving current for the semiconductor laser increases in proportional to the increase of the current intensity, and the light emission intensity also increases depending on the increase of the driving current.

In this manner, laser light source device 10 generates, for an input signal corresponding to continuous pixels for a same color, a plurality of sets of current intensity data indicating current intensities different from each other, and drives semiconductor lasers 231, 232, 233 based on the plurality of sets of current intensity data while sequentially switching the plurality of sets of current intensity data. Consequently, semiconductor lasers 231, 232, 233 are driven by a current having a plurality of current intensities that is switched during the driving. Since semiconductor lasers 231, 232, 233 slightly change their light emission wavelengths depending on the switching of the driving current, a width of the light emission wavelength of synthesized laser light can be increased. Therefore, speckle noise of laser light source device 10 or display apparatus 1 can be reduced.

Figure 2:
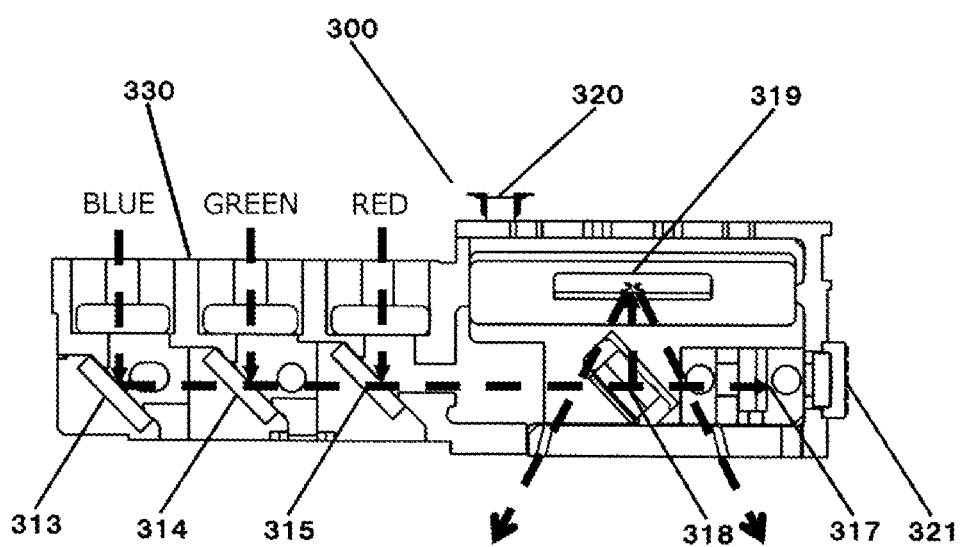
FIG. 2 is a diagram illustrating a configuration of a scanning unit according to the exemplary embodiment.

FIG. 2 is a diagram illustrating a configuration of scanning unit 300 according to the exemplary embodiment of the present disclosure. Scanning unit 300 includes three dichroic mirrors 313, 314, 315, first mirror 317, and second mirror 318. Three dichroic mirrors 313, 314, 315 introduce the laser light respectively emitted from three semiconductor lasers 233, 232, 231 in a predetermined direction. First mirror 317 reflects the laser light introduced from three dichroic mirrors 313, 314, 315. Second mirror 318 further reflects the laser light reflected by first mirror 317 to introduce to micro electro mechanical system (MEMS) mirror 319. Scanning unit 300 further includes MEMS mirror 319 for scanning laser light reflected by second mirror 318 with a first speed and a second speed that depend on an MEMS signal, temperature sensor 320 for monitoring calorific value of scanning unit 300, color sensor 321 for monitoring emission output amount of laser light, and scanning unit housing 330 to attach each component.

Dichroic mirrors 313, 314, 315 each have a surface on which a film is formed that transmits or reflects laser light having a predetermined wavelength. A film for reflecting blue laser light is formed on dichroic mirror 313. A film for transmitting blue laser light and for reflecting green laser light is formed on dichroic mirror 314. A film for transmitting blue laser light and green laser light and for reflecting red laser light is formed on dichroic mirror 315.

These optical members are supported by scanning unit housing 330. Scanning unit housing 330 functions as a heat dissipator for radiating heat generated by semiconductor lasers 231, 232, 233, and scanning unit housing 330 is formed of a material having high heat conductivity such as aluminum, copper, or zinc.

The red laser light emitted from semiconductor laser 231 proceeds to dichroic mirror 315, first mirror 317, second mirror 318 in this order, and reaches MEMS mirror 319. The green laser light emitted from semiconductor laser 232 proceeds to dichroic mirror 314, dichroic mirror 315, first mirror 317, second mirror 318 in this order, and reaches MEMS mirror 319. The blue laser light emitted from semiconductor laser 233 proceeds to dichroic mirror 313, dichroic mirror 314, dichroic mirror 315, first mirror 317, second mirror 318 in this order, and reaches MEMS mirror 319. In this manner, the red laser light, the green laser light, and the blue laser light emitted from respective semiconductor lasers are introduced on the same optical path by using dichroic mirrors 313, 314, 315, and reach MEMS mirror 319.

Then, the laser light emitted from each of three semiconductor lasers 231, 232, 233 is emitted from MEMS mirror 319 as scanning light for forming an image. This forms an image on intermediate screen 21 mounted on head up display 2, and the formed image is projected on front glass 31, forming virtual image 32 that can be viewed by a user. Note that when a far focus image is formed to be recognized by a driver, a virtual optical system is disposed between intermediate screen 21 and front glass 31.

Figure 3:
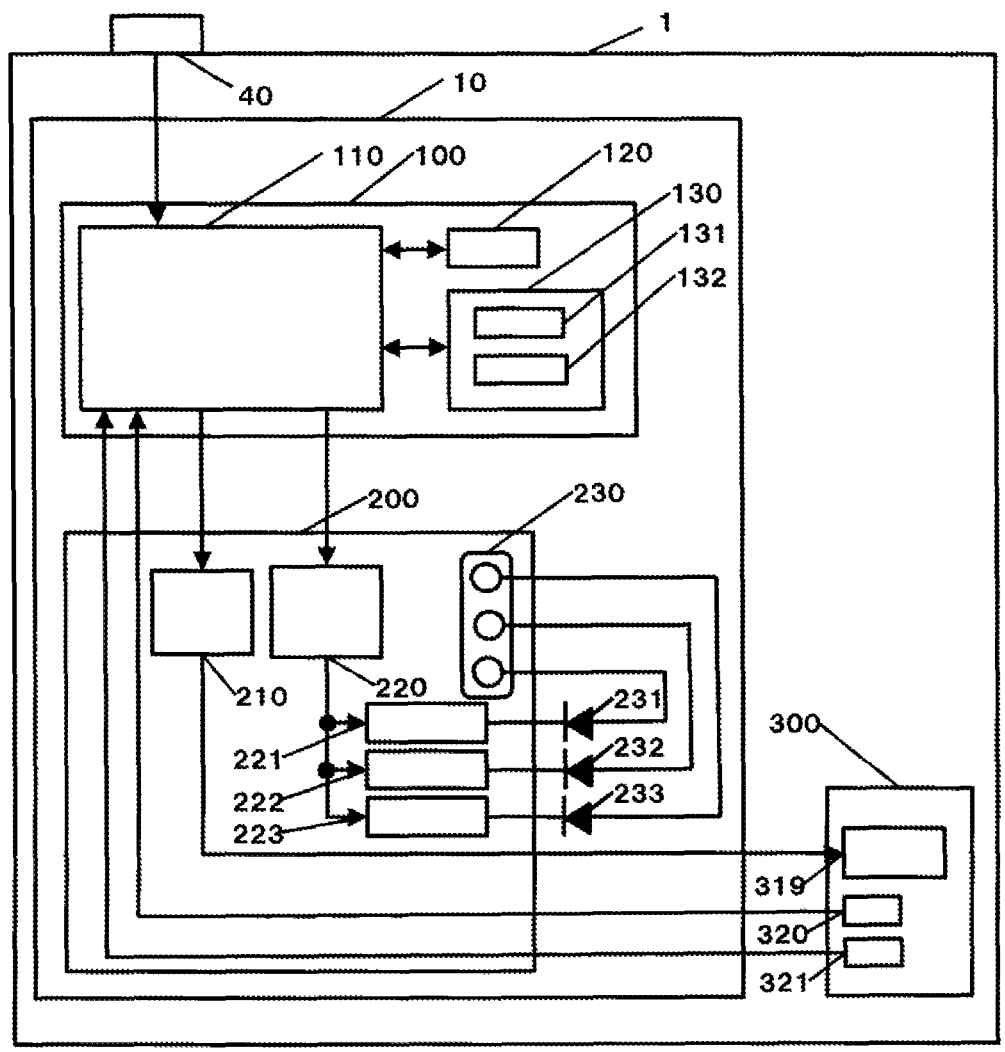
FIG. 3 is a diagram illustrating a configuration of the display apparatus according to the exemplary embodiment.

FIG. 3 is a diagram illustrating a configuration of the display apparatus according to the exemplary embodiment of the present disclosure. Specifically, FIG. 3 is a block diagram of display apparatus 1 for generating an image that can be displayed on intermediate screen 21 of head up display 2. Display apparatus 1 includes laser light source device 10, scanning unit 300, and external input terminal 40. Laser light source device 10 includes signal generator 100 and current supplying unit 200.

Signal generator 100 includes signal generating circuit 110 for generating current intensity data, image memory 120 for temporarily storing an image signal, and laser emission setting register 130 for setting the intensity of the light to be emitted from semiconductor lasers 231, 232, 233.

Laser emission setting register 130 includes first laser emission setting register 131 for setting a first emission current and an emission timing, and second laser emission setting register 132 for setting a second emission current and an emission timing.

Current supplying unit 200 includes MEMS mirror controlling circuit 210 and semiconductor laser emission controlling circuit 220. MEMS mirror controlling circuit 210 controls driving of MEMS mirror 319 in response to an MEMS driving signal transmitted from signal generating circuit 110. Semiconductor laser emission controlling circuit 220 controls emission amount of semiconductor lasers 231, 232, 233 in response to current intensity data transmitted from signal generating circuit 110. Current supplying unit 200 also includes red semiconductor laser emission controlling circuit 221, green semiconductor laser emission controlling circuit 222, and blue semiconductor laser emission controlling circuit 223 for respectively causing semiconductor lasers 231, 232, 233 to emit light in response to a signal transmitted from semiconductor laser emission controlling circuit 220. Current supplying unit 200 also includes semiconductor laser power circuit 230 for supplying power to red semiconductor laser emission controlling circuit 221, green semiconductor laser emission controlling circuit 222, and blue semiconductor laser emission controlling circuit 223.

Scanning unit 300 includes MEMS mirror 319, temperature sensor 320, and color sensor 321. MEMS mirror 319 two-dimensionally scans the laser light emitted from semiconductor lasers 231, 232, 233. Temperature sensor 320 monitors calorific value of scanning unit 300. Color sensor 321 monitors emission output amount of laser light. MEMS mirror 319 performs a first scanning for scanning in a first direction and a second scanning for scanning in a second direction perpendicular to the first direction based on a signal transmitted from MEMS mirror controlling circuit 210.

Figure 4A:
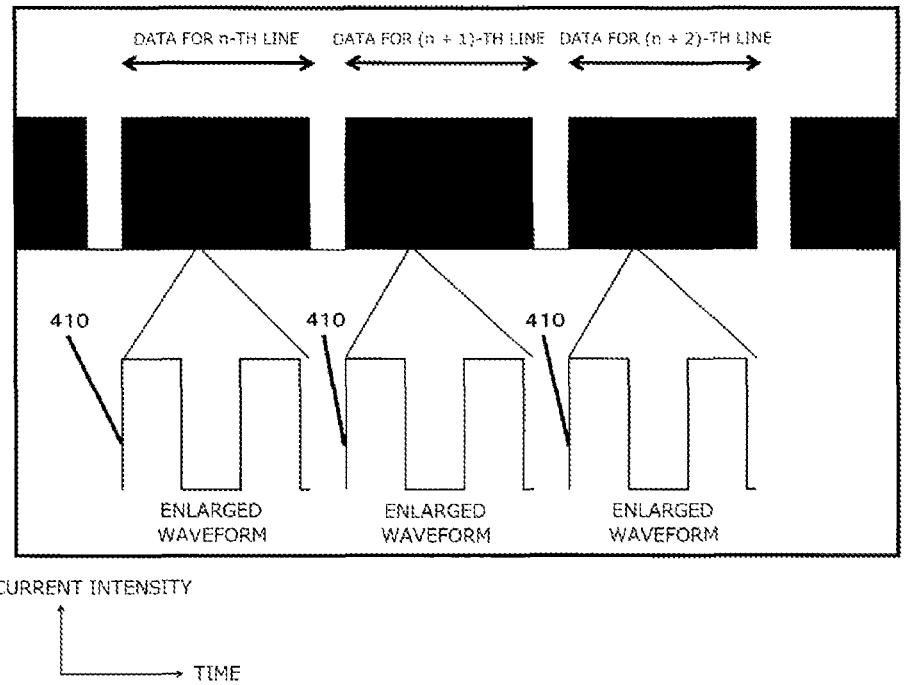
FIG. 4A is a diagram illustrating current intensity data according to the exemplary embodiment.
Figure 4B:
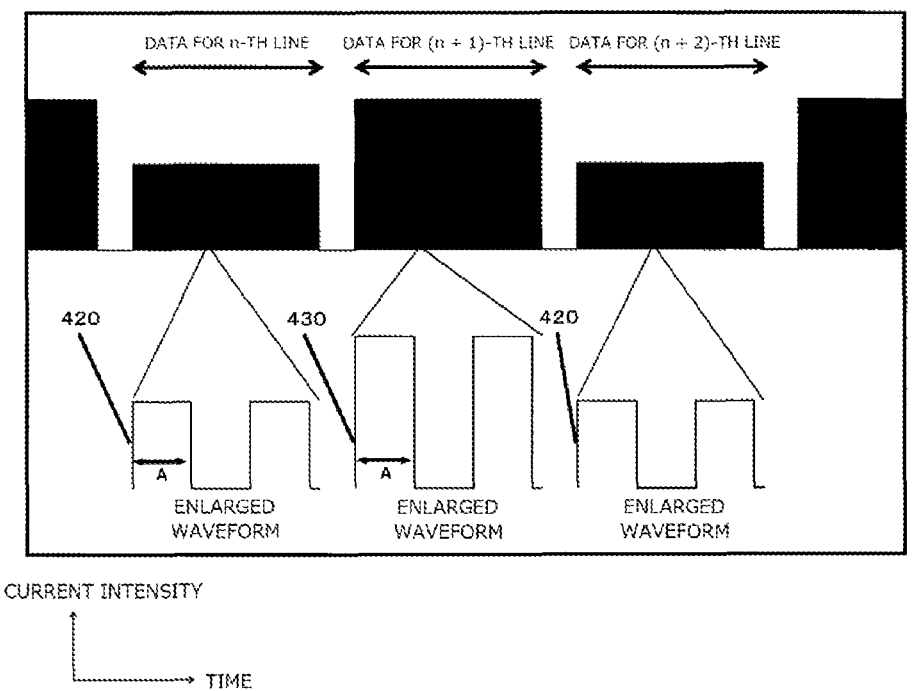
FIG. 4B is a diagram illustrating current intensity data according to the exemplary embodiment.

FIGS. 4A and 4B each are a diagram illustrating current intensity data in the exemplary embodiment of the present disclosure. FIG. 4A illustrates a waveform for an original image emission corresponding to an image signal input to signal generator 100, and FIG. 4B illustrates a first waveform for an emission corresponding to a current intensity reduced from that of the original image emission, and a second waveform for an emission corresponding to a current intensity increased from that of the original image emission. Note that the horizontal axis denotes time, and the vertical axis denotes current intensity in FIGS. 4A and 4B. Furthermore, an upper portion in each of FIGS. 4A and 4B illustrates a change in continuous current intensity data in time-series, and a lower portion thereof illustrates an enlarged waveform of the current intensity data in each line. Each enlarged waveform is a rectangular wave, and width A of one rectangular wave corresponds to emission time for one pixel and the height of the rectangular wave illustrates current intensity (hereinafter, the same).

Signal generator 100 registers, in image memory 120, waveform 410 for an original image emission corresponding to the image signal transmitted from external input terminal 40. Registered waveform 410 for the original image emission is read by signal generating circuit 110 as needed. Signal generating circuit 110 generates, from read waveform 410 for the original image emission, first waveform 420 for an emission indicating a current intensity smaller than the current intensity of waveform 410 for the original image emission, and second waveform 430 for an emission indicating a current intensity greater than the current intensity of waveform 410 for the original image emission. Signal generating circuit 110 also registers, in first laser emission setting register 131, current intensity data and timing data, which is the number of emission, emission order, and the like, of first waveform 420 for the emission. At the same time, signal generating circuit 110 registers, in second laser emission setting register 132, current intensity data and timing data, which is the number of emission, emission order, and the like, of second waveform 430 for the emission.

Figure 5:
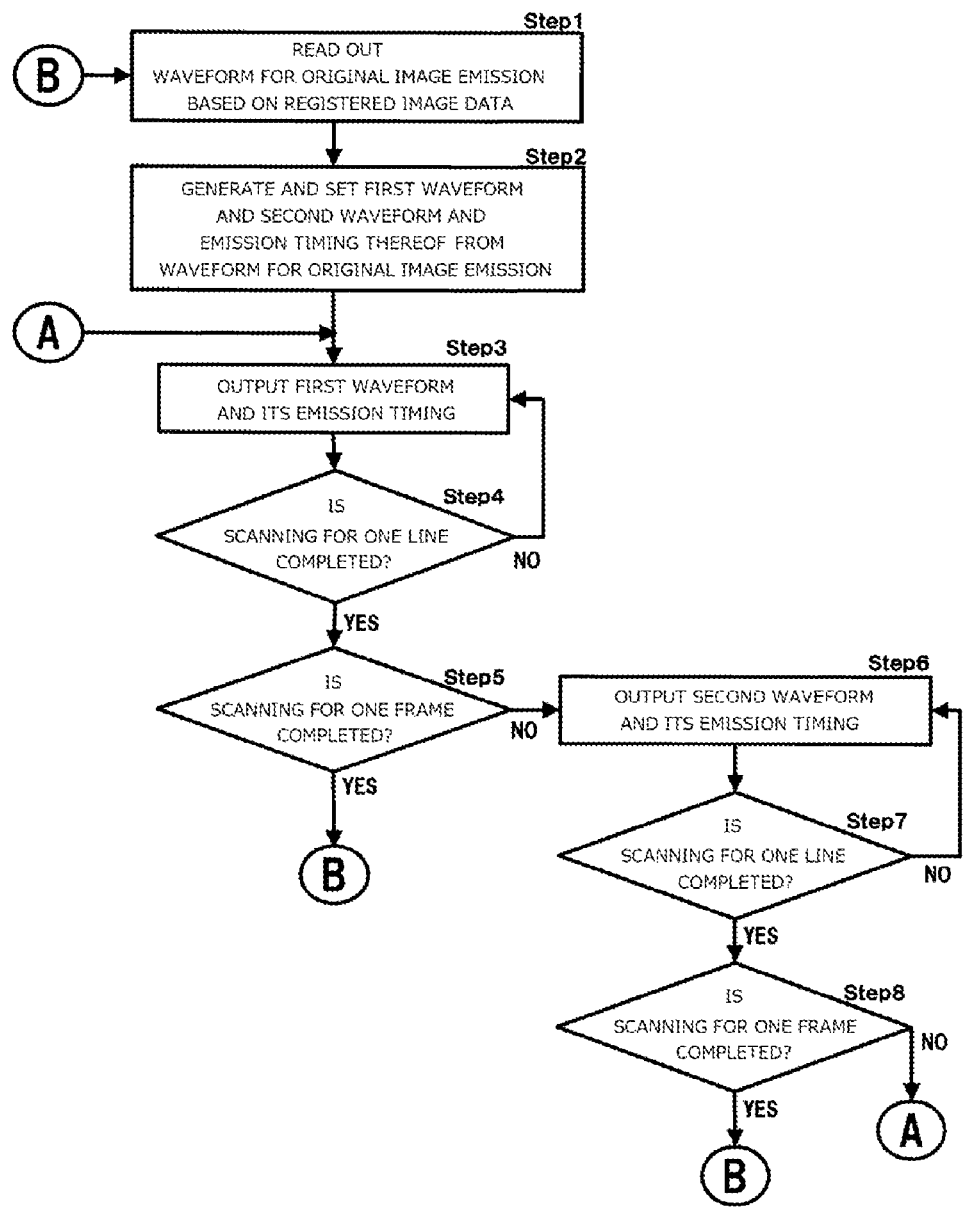
FIG. 5 is a flowchart illustrating a scanning process during image generation according to the exemplary embodiment.

FIG. 5 is a flowchart illustrating a scanning process during image generation according to the exemplary embodiment of the present disclosure. Specifically, FIG. 5 illustrates a switching process of current intensity data during scanning laser light with scanning unit 300.

Signal generating circuit 110 registers the image signal transmitted from external input terminal 40 in image memory 120. Then, Signal generating circuit 110 reads out as needed waveform 410 for original image emission based on the registered image signal from image memory 120 (Step 1).

Signal generating circuit 110 generates, from read waveform 410 for original image emission, a plurality of sets of current intensity data indicating current intensities different from each other and emission timing data. That is, signal generating circuit 110 generates first waveform 420 for an emission indicating a current intensity smaller than the current intensity of waveform 410 for the original image emission, and second waveform 430 for an emission indicating a current intensity greater than the current intensity of waveform 410 for original image emission, and also generates emission timing data of first waveform 420 and second waveform 430. Then, signal generating circuit 110 sets the current intensity data and emission timing data of first waveform 420 in first laser emission setting register 131. Signal generating circuit 110 also sets the current intensity data and emission timing data of second waveform 430 in second laser emission setting register 132 (Step 2).

Signal generating circuit 110 takes out the current intensity data and emission timing data of first waveform 420 registered in first laser emission setting register 131, and outputs the current intensity data and emission timing data of first waveform 420 to semiconductor laser emission controlling circuit 220. At this time, semiconductor laser emission controlling circuit 220 sets the current intensity data and emission timing data corresponding to each color of red, green, and blue in red semiconductor laser emission controlling circuit 221, green semiconductor laser emission controlling circuit 222, and blue semiconductor laser emission controlling circuit 223, respectively (Step 3).

Signal generating circuit 110 continues to output the current intensity data and emission timing data of first waveform 420 to semiconductor laser emission controlling circuit 220 until output of the scanning data for one line is completed while counting the output of the scanning data (Step 4).

Signal generating circuit 110 confirms whether output of the scanning data for one frame is completed each time output of the scanning data for one line is completed. At this time, when output of the scanning data for one line is completed and output of the scanning data for one frame is completed, the scanning process returns to Step 1 (Step 5).

Alternatively, when output of the scanning data for one line is completed and output of the scanning data for one frame is not completed, signal generating circuit 110 takes out the current intensity data and emission timing data of second waveform 430 registered in second laser emission setting register 132, and outputs the current intensity data and emission timing data of second waveform 430 to semiconductor laser emission controlling circuit 220. At this time, semiconductor laser emission controlling circuit 220 sets the current intensity data and emission timing data corresponding to each color of red, green, and blue in red semiconductor laser emission controlling circuit 221, green semiconductor laser emission controlling circuit 222, and blue semiconductor laser emission controlling circuit 223, respectively (Step 6).

Then, signal generating circuit 110 continues to output the current intensity data and emission timing data of second waveform 430 to semiconductor laser emission controlling circuit 220 until output of the scanning data for one line is completed while counting the output of the scanning data (Step 7).

Signal generating circuit 110 confirms whether output of the scanning data for one frame is completed each time output of the scanning data for one line is completed. At this time, when output of the scanning data for one line is completed and output of the scanning data for one frame is not completed, the scanning process returns to Step 3. Alternatively, when output of the scanning data for one line is completed and output of the scanning data for one frame is completed, the scanning process returns to Step 1 (Step 8).

Figure 6:
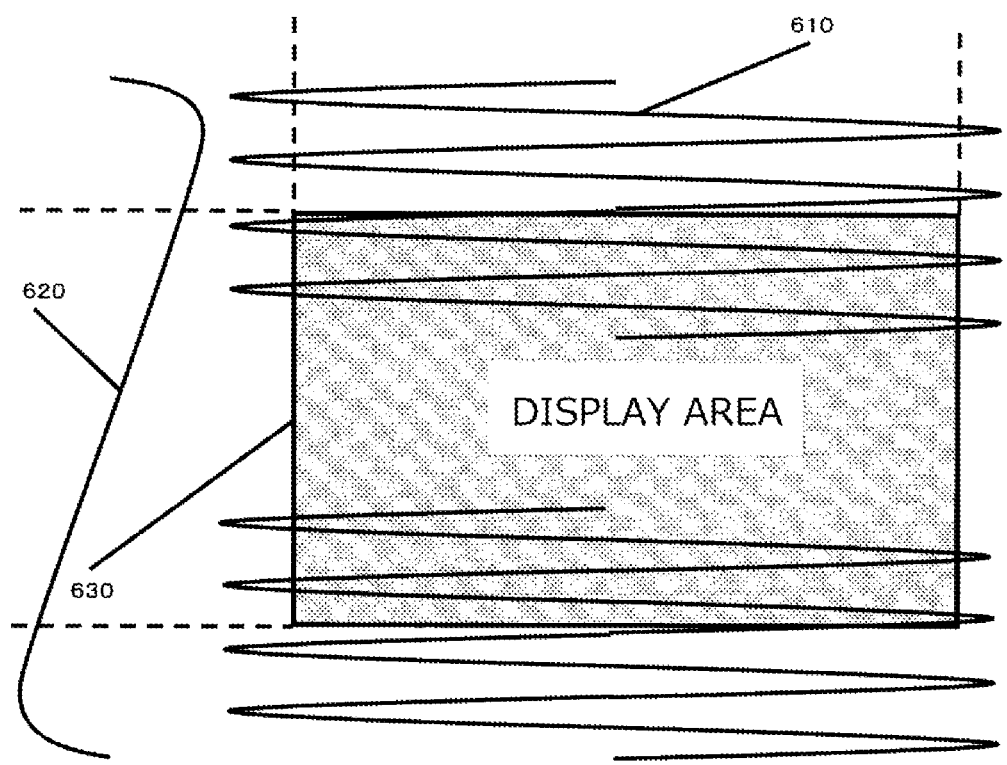
FIG. 6 is a diagram illustrating scanning directions according to the exemplary embodiment.

FIG. 6 is a diagram illustrating scanning directions according to the exemplary embodiment of the present disclosure. Specifically, FIG. 6 illustrates display area 630 of images generated by first scanning signal 610 and second scanning signal 620.

First scanning signal 610 and second scanning signal 620 are generated from an MEMS signal corresponding to first waveform 420 for the emission and second waveform 430 for the emission generated in signal generating circuit 110. The scanning direction by first scanning signal 610 (first direction) is perpendicular to the scanning direction by second scanning signal 620 (second direction), and the first scanning signal 610 is a signal that scans at a speed faster than a speed of second scanning signal 620.

Note that, first scanning signal 610 is formed by a scanning signal for scanning from the left side to the right side (right direction) of the screen, and a scanning signal for scanning from the right side to the left side (left direction) of the screen.

Figure 7A:
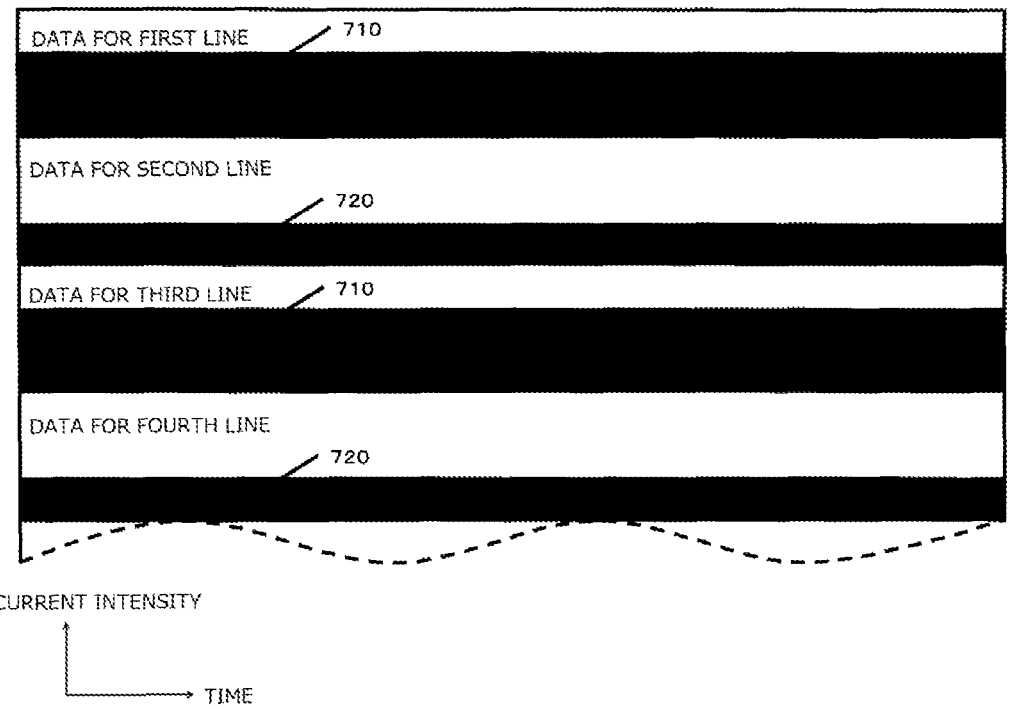
FIG. 7A is a diagram illustrating current intensity data of each line of a first frame according to the exemplary embodiment.
Figure 7B:
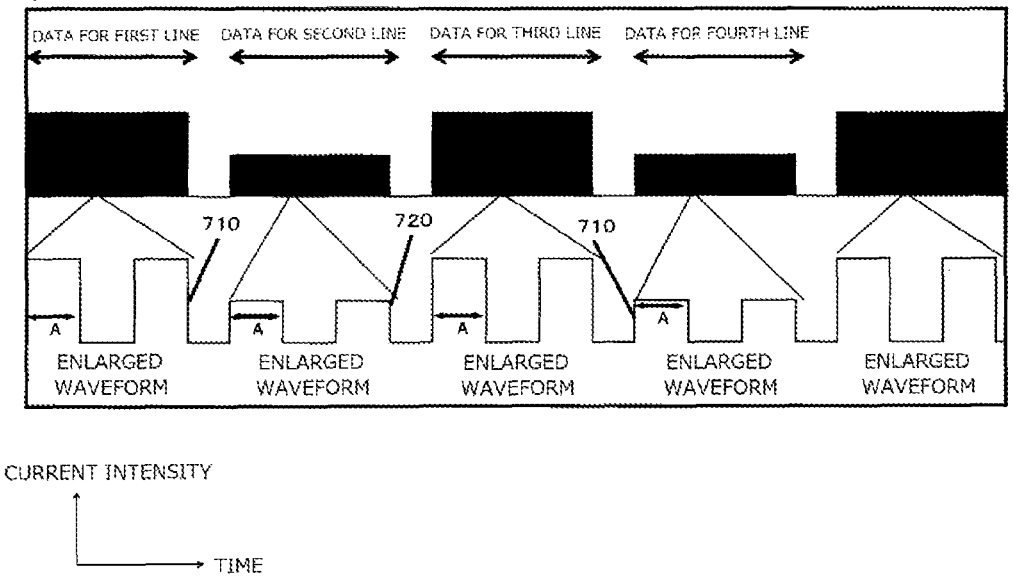
FIG. 7B is a diagram illustrating current intensity data of each line of the first frame according to the exemplary embodiment.

FIGS. 7A and 7B each are a diagram illustrating current intensity data of each line of a first frame according to the exemplary embodiment. FIG. 7A is a diagram illustrating current intensity data of each line in a display state, and FIG. 7B is a diagram illustrating current intensity data of each line in an emission state. Note that the horizontal axis denotes time and the vertical axis denotes current intensity in FIGS. 7A and 7B.

First waveform 710 for an emission is a waveform generated from the current intensity data corresponding to first waveform 420 for the emission set in first laser emission setting register 131. First waveform 710 for the emission is used when odd lines (first line and the like) are scanned from the left side to the right side.

Second waveform 720 for an emission is a waveform generated from the current intensity data corresponding to second waveform 430 for the emission set in second laser emission setting register 132. Second waveform 720 is used when even lines (second line and the like) are scanned from the right side to the left side. Herein, second waveform 720 for the emission corresponding to second waveform 430 for the emission is set to have a current intensity smaller than the current intensity of first waveform 710 for the emission corresponding to first waveform 420 for the emission.

Signal generator 100 switches the current intensity data to form, for example, first waveform 710 for the first line, second waveform 720 for the second line, first waveform 710 for the third line, and second waveform 720 for the fourth line. In this manner, scanning unit 300 switches the current intensity data for each line to be scanned by laser light, which can average gray scale gap between adjacent lines of displayed image generated during driving semiconductor lasers 231, 232, 233 for light emission by using a plurality of sets of current intensity data, thereby suppressing deterioration of image quality.

Furthermore, signal generator 100 switches the current intensity data, for example, to second waveform 720 from first waveform 710 at the moment when the scanning is switched from the first line to the second line, and to first waveform 710 from second waveform 720 at the moment when the scanning is switched from the second line to the third line. In this manner, the current intensity data is switched at the moment when scanning is switched from the left direction to the right direction or at the moment when scanning is switched from the right direction to the left direction, which can effectively average gray scale gap between adjacent lines of displayed image generated during driving semiconductor lasers 231, 232, 233 for light emission by using a plurality of sets of current intensity data, thereby suppressing deterioration of image quality.

Note that one pixel time A denotes an emission time for one pixel of first waveform 710 and second waveform 720.

Figure 8A:
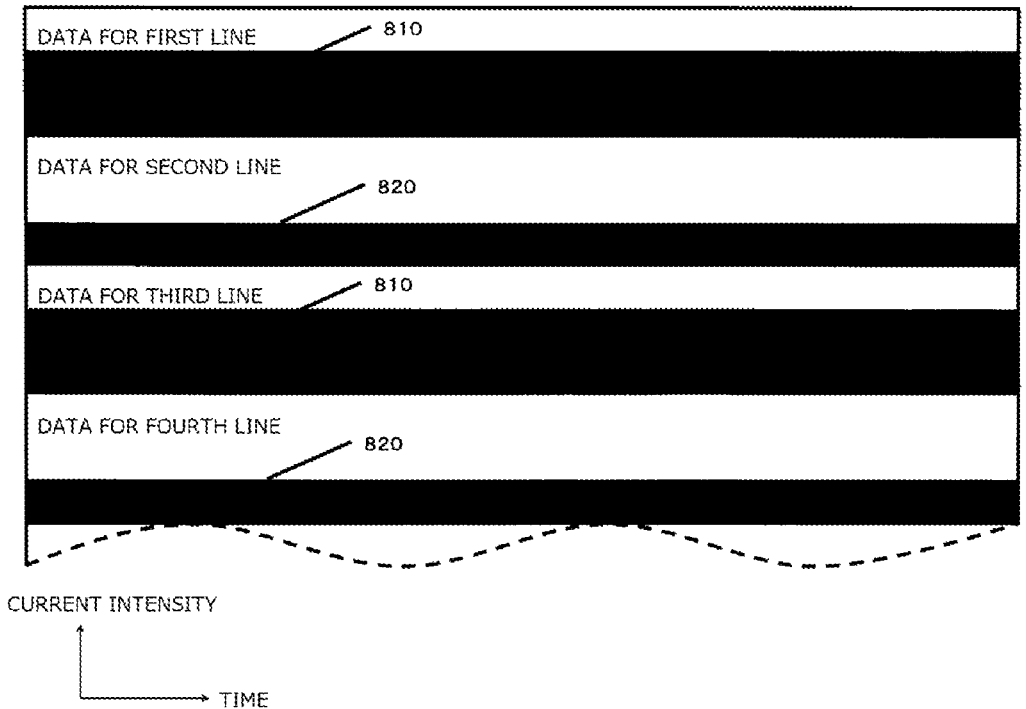
FIG. 8A is a diagram illustrating current intensity data of a first frame according to the exemplary embodiment.
Figure 8B:
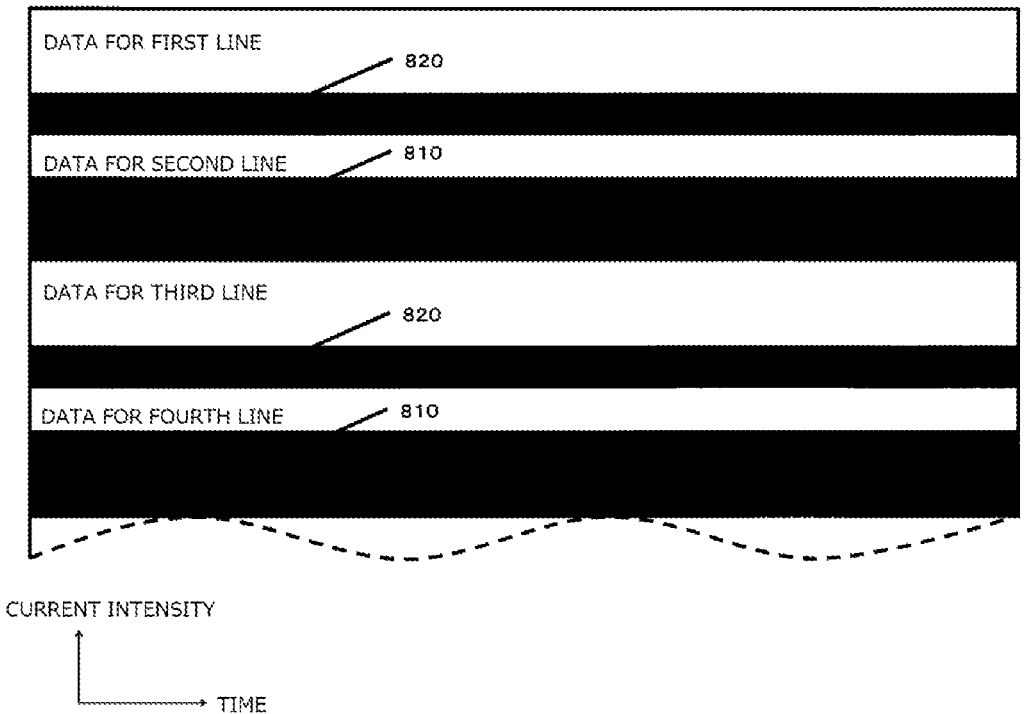
FIG. 8B is a diagram illustrating current intensity data of a second frame according to the exemplary embodiment.

FIGS. 8A and 8B are diagrams illustrating current intensity data in a first frame and a second frame, respectively, according to the exemplary embodiment. FIG. 8A is a diagram illustrating current intensity data of each line in the first frame, and FIG. 8B is a diagram illustrating current intensity data of each line in the second frame. Note that the horizontal axis denotes time and the vertical axis denotes current intensity in FIGS. 8A and 8B.

First waveform 810 for an emission is a waveform generated from the current intensity data corresponding to first waveform 420 for the emission set in first laser emission setting register 131. First waveform 810 is used during scanning odd lines (first line and the like) of odd frames (first frame and the like) from the left side to the right side, or scanning even lines (second line and the like) of even frames (second frame and the like) from the right side to the left side.

Second waveform 820 for an emission is a waveform generated from the current intensity data corresponding to second waveform 430 for the emission set in second laser emission setting register 132. Second waveform 820 is used during scanning even lines (second line and the like) of odd frames (first frame and the like) from the right side to the left side, or scanning odd lines (first line and the like) of even frames (second frame and the like) from the left side to the right side.

Scanning unit 300 switches the current intensity data based on the case of odd line of odd frame, even line of odd frame, odd line of even frame, or even line of even frame, which can effectively average gray scale gap between lines and between frames of displayed image generated during driving semiconductor lasers 231, 232, 233 for light emission by using a plurality of sets of current intensity data, thereby suppressing deterioration of image quality.

Signal generator 100 switches current intensity data to form, for example, first waveform 810 for the first line of the first frame, second waveform 820 for the second line of the first frame, second waveform 820 for the first line of the second frame, and first waveform 810 for the second line of the second frame. In this manner, the current intensity data is switched in synchronization with the cycle of the first scanning, and the switching order of the current intensity data is alternated in synchronization with the cycle of the second scanning Thus, a plurality of different sets of current intensity data is set for the first scanning for performing a high speed scanning in the two dimensional scanning display apparatus that performs the first scanning and the second scanning, which increases the light emission wavelength width of light emitted from semiconductor lasers 231, 232, 233, thereby effectively reducing speckle noise.

First Modification

Figure 9:
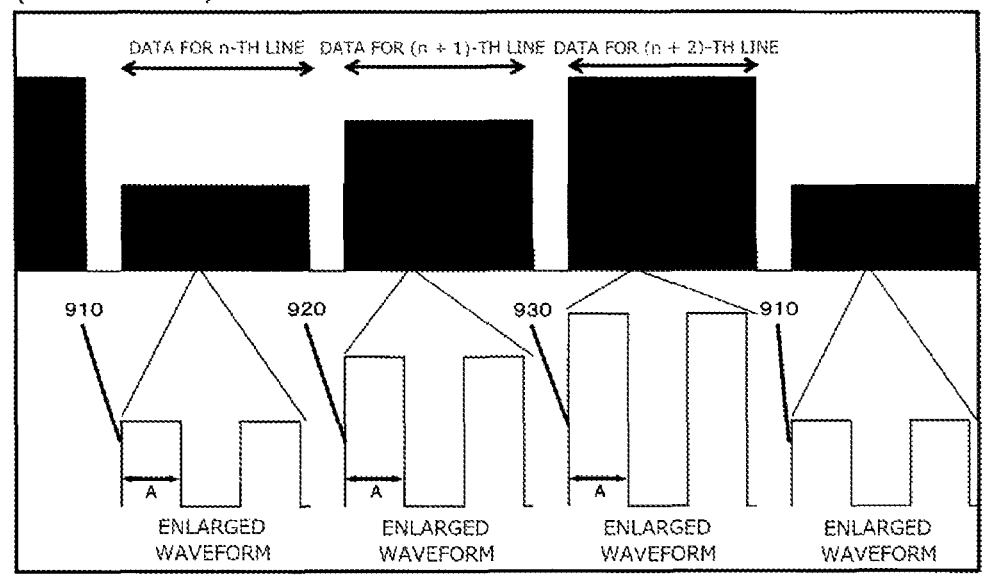
FIG. 9 is a diagram illustrating current intensity data of each line of a first frame according to a first modification of the exemplary embodiment.

FIG. 9 is a diagram illustrating current intensity data of each line of a first frame according to a first modification of the exemplary embodiment. Specifically, FIG. 9 illustrates waveforms for emissions based on three types of current intensity data. Note that FIG. 9 is the diagram adding third waveform 930 for an emission that is a third waveform for an emission to the two types of current intensity data illustrated in FIG. 7. In FIG. 9, the horizontal axis denotes time and the vertical axis denotes current intensity.

To generate third waveform 930 for an emission, a third laser emission setting register is needed in addition to first laser emission setting register 131 and second laser emission setting register 132. Thus, the third laser emission setting register (not shown in the drawing) is provided in laser emission setting register 130 in the case of using waveforms for the emissions based on three types of current intensity data.

Signal generator 100 switches the current intensity data to form, for example, first waveform 910 for the first line, second waveform 920 for the second line, third waveform 930 for the third line. Adding third waveform 930 in this manner can further reduce speckle noise.

Note that, one pixel time A denotes an emission time for one pixel of first waveform 910, second waveform 920, and third waveform 930.

Second Modification

Figure 10A:
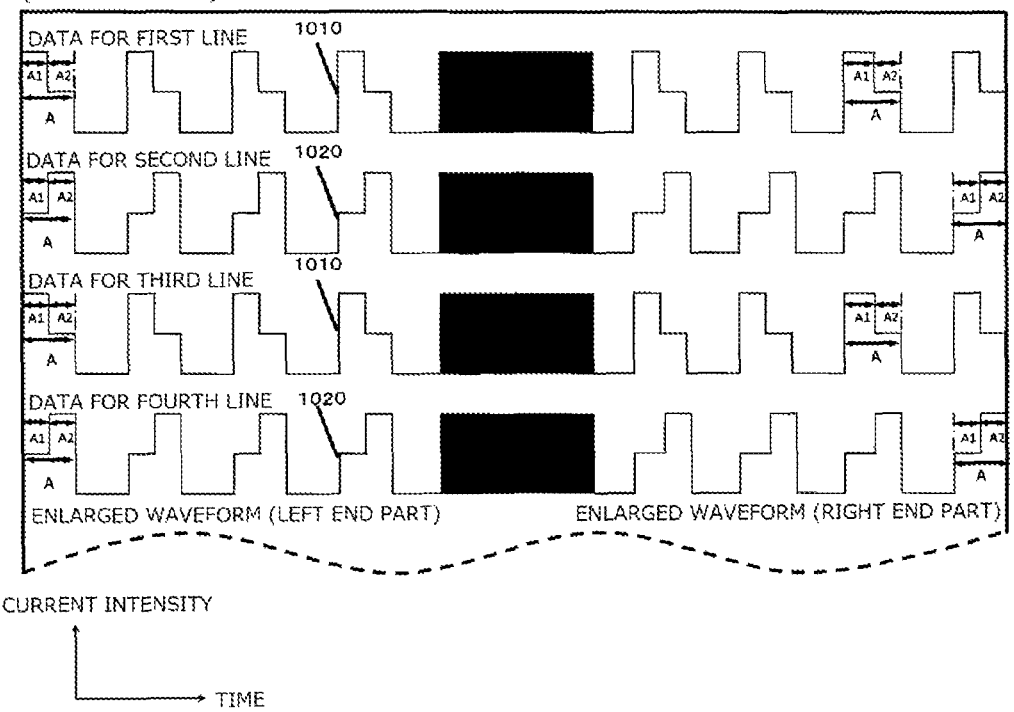
FIG. 10A is a diagram illustrating current intensity data forming a waveform for an emission with two types of current intensities during one pixel time according to a second modification of the exemplary embodiment.
Figure 10B:
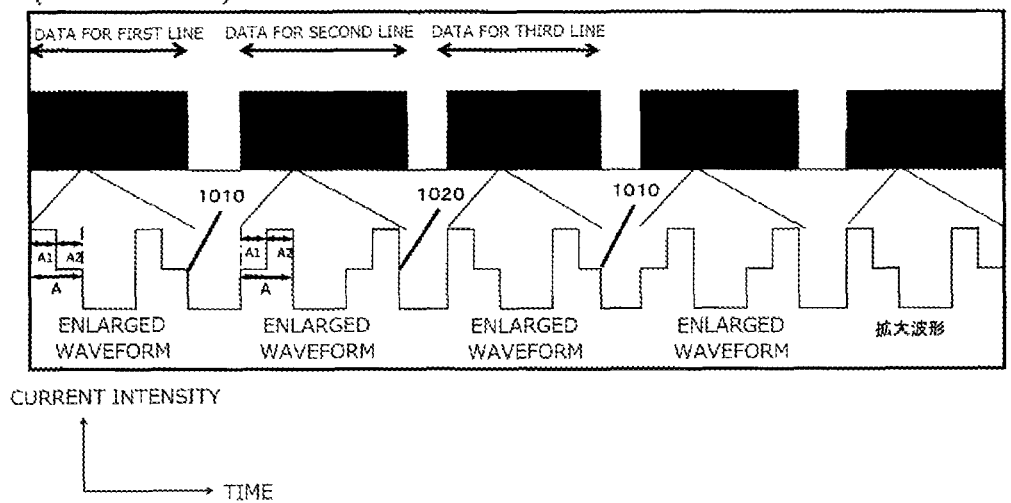
FIG. 10B is a diagram illustrating current intensity data forming the waveform for an emission with the two types of current intensities during one pixel time according to the second modification of the exemplary embodiment.

FIGS. 10A and 10B each are a diagram illustrating current intensity data forming a waveform for the emission with two types of current intensity data during one pixel time according to a second modification of the exemplary embodiment. Both FIG. 10A and FIG. 10B are diagrams illustrating current intensity data of a first frame. In FIG. 10A and FIG. 10B, the horizontal axis denotes time, and the vertical axis denotes current intensity.

Each of first waveform 1010 for an emission and second waveform 1020 for an emission is formed of a waveform during time A1 corresponding to former half of one pixel time A and a waveform during time A2 corresponding to later half of one pixel time A. Herein, one pixel time A is the sum of time A1 and time A2.

First waveform 1010 for the emission is set such that the current intensity of the waveform during time A1 is greater than the current intensity of the waveform during time A2. Second waveform 1020 for the emission is set such that the current intensity of the waveform during time A2 is greater than the current intensity of the waveform during time A1.

Signal generator 100 generates current intensity data corresponding to each of the former half and the later half of one pixel time that is a short period. The current intensity data for the former half is different from the current intensity data for the later half, and semiconductor lasers 231, 232, 233 are driven by these current intensity data. Since semiconductor lasers 231, 232, 233 slightly change their light emission wavelength depending on the switching of the driving current, a width of the light emission wavelength of synthesized laser light can be increased. Therefore, speckle noise of laser light source device 10 or display apparatus 1 can be reduced. In this manner, signal generator 100 switches the current intensity data in a time interval shorter than one pixel time constituting an input one data signal, so that semiconductor lasers 231, 232, 233 are driven by a plurality of different current intensities. Since semiconductor lasers 231, 232, 233 change their light emission wavelength depending on the switching of the driving current, the width of the light emission wavelength of the synthesized laser light can be increased. Therefore, speckle noise of laser light source device 10 or display apparatus 1 can be reduced. Furthermore, signal generator 100 alternates the order of the current intensity data in one pixel time in synchronization with the cycle of the second scanning, which averages gray scale gap of each line of displayed image generated during driving semiconductor lasers 231, 232, 233 for emission by using a plurality of different sets of current intensity data, thereby suppressing deterioration of image quality.

Furthermore, first waveform 1010 is used in odd lines (first line and the like) and second waveform 1020 is used in even lines (second line and the like), thereby averaging gray scale gap in a line of displayed image generated by different sets of current intensity data used in one pixel time.

Furthermore, signal generator 100 switches current intensity data to form, for example, first waveform 1010 for the first line, second waveform 1020 for the second line, and first waveform 1010 for the third line. In this manner, signal generator 100 alternates current intensity data for each cycle for scanning one line of one frame, which can effectively average gray scale gap between lines of displayed image generated during driving semiconductor lasers 231, 232, 233 for light emission by using a plurality of different sets of current intensity data, thereby further suppressing deterioration of image quality.

Figure 11A:
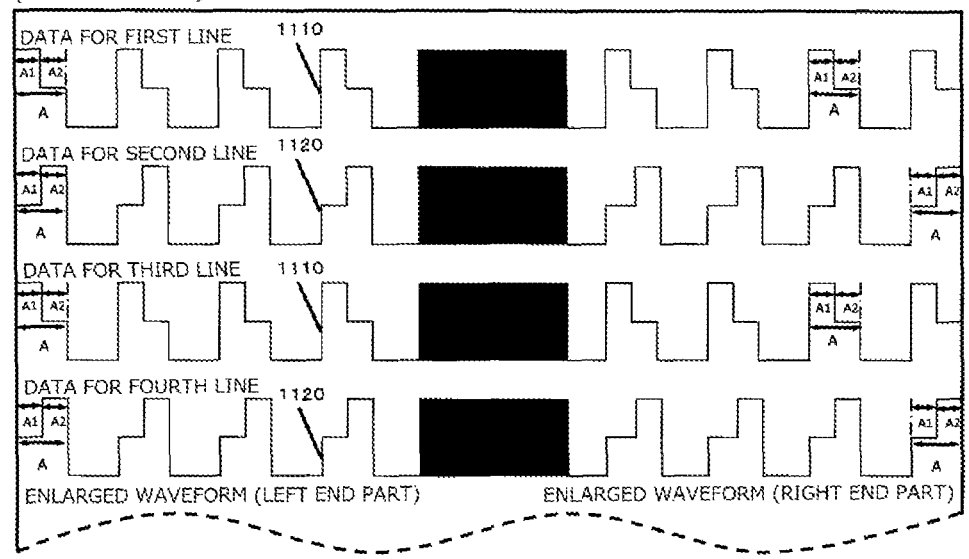
FIG. 11A is a diagram illustrating current intensity data of a first frame according to the second modification of the exemplary embodiment.
Figure 11A:
Figure 11B:
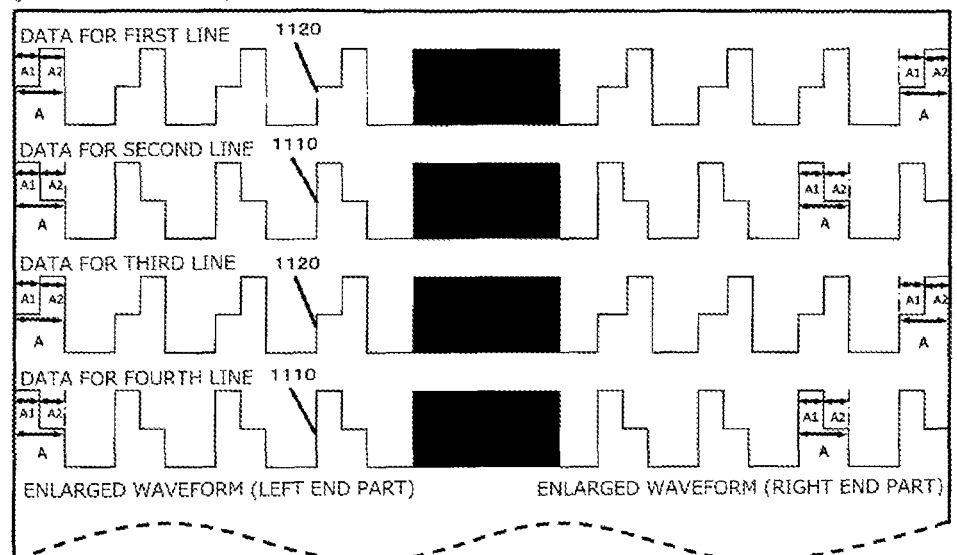
FIG. 11B is a diagram illustrating current intensity data of a second frame according to the second modification of the exemplary embodiment.
Figure 11B:

FIGS. 11A and 11B are diagrams illustrating current intensity data for a first frame and a second frame, respectively, according to the second modification of the exemplary embodiment of the present disclosure. FIG. 11A is a diagram illustrating current intensity data of each line for the first frame, and FIG. 11B is a diagram illustrating current intensity data of each line for the second frame. Note that in FIGS. 11A and 11B, the horizontal axis denotes time and the vertical axis denotes current intensity.

First waveform 1110 for the emission and second waveform 1120 for the emission are formed of a waveform during time A1 corresponding to the former half of one pixel time A and a waveform during time A2 corresponding to the later half of one pixel time A. Herein, one pixel time A is the sum of time A1 and time A2.

First waveform 1110 for the emission is set such that the current intensity of the waveform during time A1 is greater than the current intensity of the waveform during time A2. Second waveform 1120 for the emission is set such that the current intensity of the waveform during time A2 is greater than the current intensity of the waveform during time A1.

Semiconductor lasers 231, 232, 233 are driven by different sets of current intensity data in the respective former half and later half of one pixel time that is a short period. Since semiconductor lasers 231, 232, 233 changes their light emission wavelength depending on the switching of the driving current, a width of the light emission wavelength of the synthesized laser light can be increased. Therefore, speckle noise of laser light source device 10 or display apparatus 1 can be reduced.

Furthermore, signal generator 100 uses first waveform 1110 for odd lines (first line and the like) of odd frames (first frame and the like), and uses second waveform 1120 for even lines (second line and the like) of odd frames (first frame and the like). At the same time, signal generator 100 uses second waveform 1120 for odd lines (first line and the like) of even frames (second frame and the like), and uses first waveform 1110 for even lines (second line and the like) of even frames (second frame and the like). In this manner, signal generator 100 alternates the order of the current intensity data for each cycle of one frame, which can effectively average gray scale gap between frames of displayed image generated during driving semiconductor lasers 231, 232, 233 for light emission by using a plurality of different sets of current intensity data, thereby suppressing deterioration of image quality.

Third Modification

Figure 12:
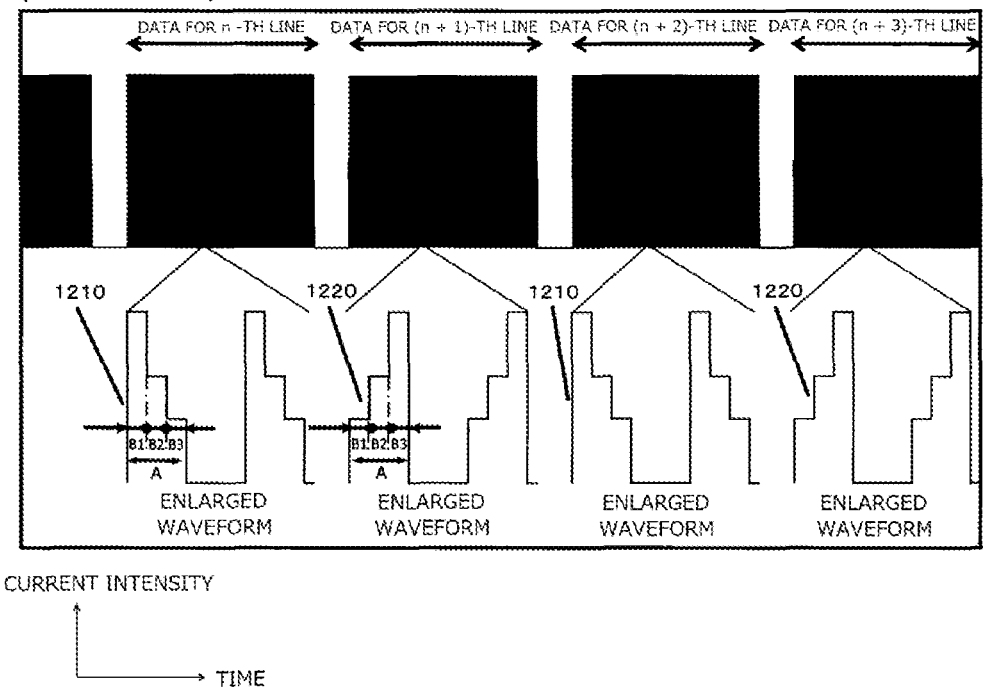
FIG. 12 is a diagram illustrating current intensity data forming a waveform for a waveform with three types of current intensities during one pixel time according to a third modification of the exemplary embodiment.

FIG. 12 is a diagram illustrating current intensity data forming a waveform with three types of current intensities during one pixel time according to a third modification of the exemplary embodiment. FIG. 12 is a diagram also illustrating current intensity data for each line of a first frame.

Note that in FIG. 12, the horizontal axis denotes time and the vertical axis denotes current intensity.

First waveform 1210 for an emission and second waveform 1220 for an emission are formed of a waveform during time B1 corresponding to a former part of one pixel time A, a waveform during time B2 corresponding to a middle part of one pixel time A, and a waveform during time B3 corresponding to a later part of one pixel time A. Herein, one pixel time A is the sum of time B1 and time B2 and time B3.

First waveform 1210 for the emission is set such that the current intensity of the waveform during time B2 is greater than the current intensity of the waveform during time B3, and is set such that the current intensity of the waveform during time B1 is greater than the current intensity of the waveform during time B2. Second waveform 1220 for the emission is set such that the current intensity of the waveform during time B2 is greater than the current intensity of the waveform during time B1, and is set such that the current intensity of the waveform during time B3 is greater than the current intensity of the waveform during time B2.

Semiconductor lasers 231, 232, 233 are driven by different sets of current intensity data for the respective former part, middle part, and later part of one pixel time that is a short time Since semiconductor lasers 231, 232, 233 change their light emission wavelengths depending on the switching of the driving current, a width of the emission wavelength of the synthesized laser light can be increased. Therefore, speckle noise of laser light source device 10 or display apparatus 1 can be reduced.

Furthermore, the signal generator 100 uses first waveform 1210 for odd lines (first line and the like), and uses second waveform 1220 for even lines (second line and the like), so that gray scale in a line of displayed image generated due to different sets of current intensity data used in one pixel time can be averaged.

Furthermore, as compared with the case of FIG. 10, the current intensity corresponding to time B3 is added, so that speckle noise can be further reduced.

Furthermore, emission intensity can be averaged by alternating, for each frame, the current intensity data for first waveform 1210 and the current intensity data for second waveform 1220, thereby suppressing image deterioration.

Hereinafter, common matters of the exemplary embodiment and the modifications of the present disclosure will be described.

Figure 13:
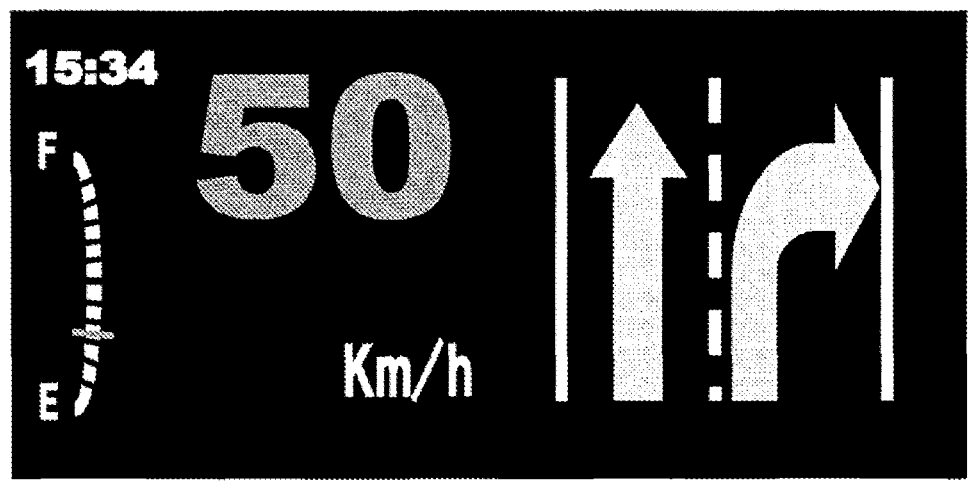
FIG. 13 is a diagram illustrating an image displayed with a single color according to the exemplary embodiment.

FIG. 13 is a diagram illustrating an example of an image displayed with a single color according to the exemplary embodiment, and illustrates a state where a plurality of different sets of current intensity data is supplied to current supplying unit 200 for a character (for example, 50) and a signage (for example, arrows) displayed with a single color.

A user feels heavy speckle noise to a character or a signage displayed with a single color. Feeling of the speckle noise by the user can be dramatically reduced by supplying a plurality of different sets of current intensity data to the current supplying unit 200 for at least a character or a signage displayed with a single color.

At this time, signal generator 100 generates a plurality of different sets of current intensity data for the input signal corresponding to continuous pixels for a same color, and determines that the input signal is a signal for pixels displayed with a same color when the current intensity data is continuously same. Then, signal generator 100 switches the current intensity data for the input signal corresponding to the pixels displayed with a same color. In this manner, signal generator 100 determines that the input signal is for a same color when the current intensity data is continuously same, and switches the current intensity data for the input signal corresponding to continuous pixels for a same color. This makes the user to hardly recognize irritation feeling generated due to speckle noise even when a width of emission wavelength is narrow because of continuous same color.

Figure 14A:
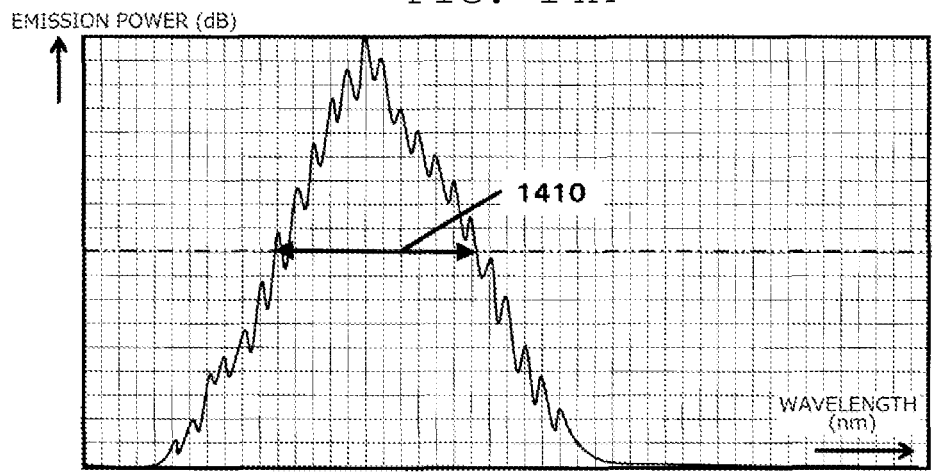
FIG. 14A is a diagram illustrating a relation between wavelength and light emission power of light emitted from a semiconductor laser.
Figure 14B:
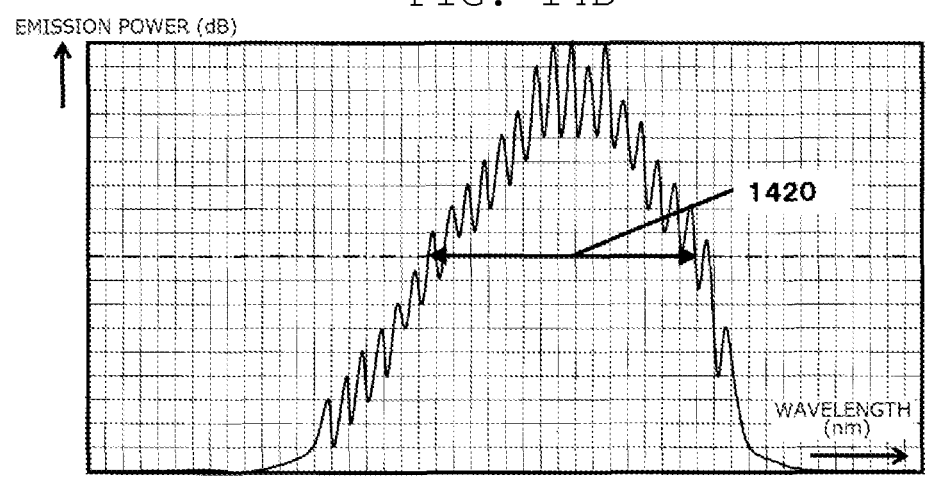
FIG. 14B is a diagram illustrating a relation between wavelength and light emission power of light emitted from the semiconductor laser.
Figure 14C:
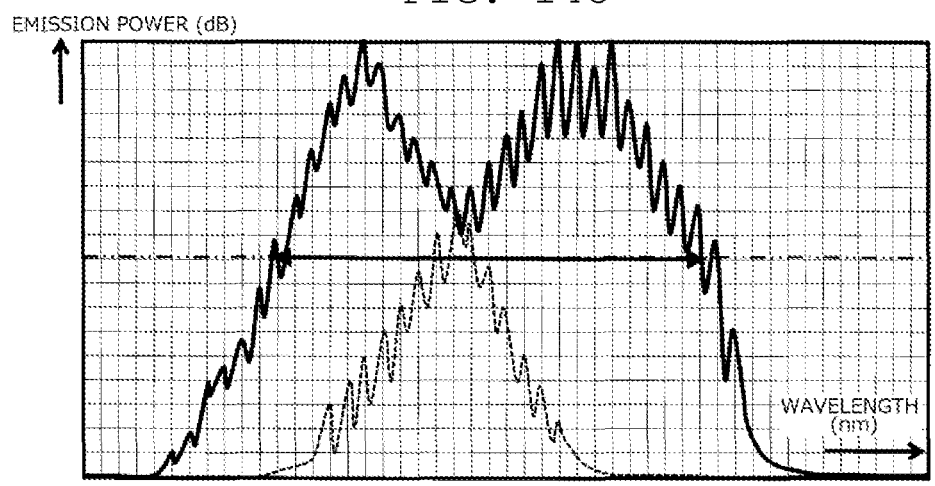
FIG. 14C is a diagram illustrating a relation between wavelength and light emission power of light emitted from the semiconductor laser.

FIGS. 14A, 14B and 14C each are a diagram illustrating a relation between wavelength and emission power of light emitted from the semiconductor laser, and the horizontal axis denotes waveform and the vertical axis denotes emission power. FIG. 14A is a graph illustrating a relation between wavelength and emission power of laser light based on the current intensity data set in first laser emission setting register 131, and FIG. 14B is a graph illustrating a relation between wavelength and emission power of laser light based on the current intensity data set in second laser emission setting register 132. FIG. 14C is a graph synthesizing the graph of 14A and the graph of 14B.

As is understood from FIG. 14A and FIG. 14B, the center wavelength of laser light changes due to the change of the driving current. That is, the center wavelength of the laser light is changed on the long wavelength side due to the change from a first driving current based on the current intensity data set in first laser emission setting register 131 to a second driving current based on the current intensity data set in second laser emission setting register 132. Herein, first wavelength width 1410 of FIG. 14A is a half value width of laser light emitted based on the first driving current, and second half value width 1420 of FIG. 14B is a half value width of laser light emitted based on the second driving current. The half value width in the synthesized graph of FIG. 14C is the synthesis of first wavelength width 1410 illustrated in FIG. 14A and second wavelength width 1420 illustrated in FIG. 14B. FIG. 14C thus illustrates the width of the light emission wavelength of the synthesis of the emission power generated during scanning from the left side to the right side based on the current intensity data set in first laser emission setting register 131 and the emission power generated during scanning from the right side to the left side based on the current intensity data set in second laser emission setting register 132.

In a conventional method, scanning is performed from the left side to the right side using the current intensity data set in first laser emission setting register 131, and then scanning is performed from the right side to the left side using the same current intensity data. Consequently, the width of the emission wavelength of the light emitted from the semiconductor laser only uses first wavelength width 1410. That is, the width of the light emission wavelength illustrated in FIG. 14A is used.

In contrast, scanning is performed from the left side to the right side using the current intensity data set in first laser emission setting register 131, and scanning is performed from the right side to the left side using the current intensity data set in second laser emission setting register 132 in the exemplary embodiment of the present disclosure. Therefore, the width of the emission wavelength of the light emitted from the semiconductor laser uses both first wavelength width 1410 and second wavelength width 1420. That is, the width of the emission wavelength illustrated in FIG. 14C is used, thereby increasing the width of the emission wavelength as compared with the conventional method.

The present disclosure is capable of reducing speckle noise caused by a semiconductor laser, so that the present disclosure can be applied to a laser light source device and a display apparatus using a semiconductor laser for a light source.

What is claimed is:

1. A display apparatus comprising:
a semiconductor laser for emitting laser light;
a scanning unit to perform a first scanning for scanning of the laser light in a first direction and a second direction along a first axis, and a second scanning for scanning of the laser light along a second axis perpendicular to the first axis;
a current supplying unit to supply a driving current to the semiconductor laser; and
a signal generator to generate current intensity data for setting an intensity of the driving current,
wherein the signal generator generates, for an input signal corresponding to continuous pixels for a same color, a plurality of sets of the current intensity data indicating current intensities different from each other in a time interval shorter than one pixel time, and transmits the plurality of sets of the current intensity data to the current supplying unit while sequentially alternating the plurality of sets of the current intensity data in accordance with the first or second direction of scanning along the first axis such that the current intensity increases within each one pixel time when scanning an nth row in the first direction and decreases within each one pixel time when scanning an nth+1 row in the second direction for a plurality of rows along the second axis, and
wherein the current supplying unit drives the semiconductor laser based on the plurality of sets of the current intensity data.

2. The display apparatus according to claim 1, wherein the signal generator alternates the plurality of sets of the current intensity data at a moment when the scanning unit alternates a scanning of the laser light from a left direction to a right direction, or at a moment when the scanning unit alternates a scanning of the laser light from the right direction to the left direction.

3. The display apparatus according to claim 1, wherein the semiconductor laser emits light at different light emission intensities within each one pixel of time, the different light emission intensities corresponding to the different current intensities within the plurality of sets of the current intensity data.

4. The display apparatus according to claim 1, wherein in accordance with the scanning direction along the first axis the current intensity changes from high to low within each one pixel time when scanning in a left-to-right direction and changes from low to high within each one pixel time when scanning in a right-to-left direction.

5. The display apparatus according to claim 1, wherein the semiconductor laser emits light at three different light emission intensities within each one pixel of time, the three different light emission intensities corresponding to the different current intensities within the plurality of sets of the current intensity data.

* * * * *